United States Patent
Tsai et al.

(10) Patent No.: US 11,177,342 B1
(45) Date of Patent: Nov. 16, 2021

(54) SCHOTTKY DIODE WITH MULTIPLE GUARD RING STRUCTURES

(71) Applicant: TAIWAN SEMICONDUCTOR CO., LTD., New Taipei (TW)

(72) Inventors: Yi-Lung Tsai, New Taipei (TW); Syed Sarwar Imam, New Taipei (TW); Yao-Wei Chuang, New Taipei (TW); Ming-Lou Tung, New Taipei (TW)

(73) Assignee: TAIWAN SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 16/935,991

(22) Filed: Jul. 22, 2020

(30) Foreign Application Priority Data

Jun. 2, 2020 (TW) ................................ 109118410

(51) Int. Cl.
*H01L 29/06* (2006.01)
*H01L 29/872* (2006.01)
*H01L 29/66* (2006.01)

(52) U.S. Cl.
CPC .... *H01L 29/0619* (2013.01); *H01L 29/66143* (2013.01); *H01L 29/872* (2013.01)

(58) Field of Classification Search
CPC ........... H01L 29/0619; H01L 29/66143; H01L 29/66212; H01L 29/872–8725; H01L 27/0766; H01L 51/0579
See application file for complete search history.

(56) References Cited

U.S. PATENT DOCUMENTS

| | | | | |
|---|---|---|---|---|
| 6,936,850 B2 * | 8/2005 | Friedrichs | ........... | H01L 21/0485 257/109 |
| 8,704,295 B1 * | 4/2014 | Darwish | ........... | H01L 29/66727 257/330 |
| 10,439,075 B1 * | 10/2019 | Quddus | ............... | H01L 29/7806 |
| 2005/0062124 A1 * | 3/2005 | Chiola | .............. | H01L 29/66143 257/476 |
| 2005/0127464 A1 * | 6/2005 | Wu | ...................... | H01L 27/0814 257/471 |
| 2005/0230744 A1 * | 10/2005 | Wu | ...................... | H01L 29/8725 257/330 |
| 2005/0230777 A1 * | 10/2005 | Chiola | ................ | H01L 27/0802 257/480 |
| 2009/0289262 A1 * | 11/2009 | Zhang | ................. | H01L 29/0615 257/77 |

(Continued)

*Primary Examiner* — Shahed Ahmed
*Assistant Examiner* — Khatib A Rahman
(74) *Attorney, Agent, or Firm* — Muncy, Geissler, Olds & Lowe, P.C.

(57) ABSTRACT

A Schottky diode with multiple guard ring structures includes a semiconductor base layer, a back metal layer, an epitaxial layer, a dielectric layer, a first metal layer, a passivation layer and a second metal layer. The epitaxial layer on the semiconductor base layer includes a terminal trench structure, a first ion implantation guard ring, a second ion implantation guard ring and a third ion implantation guard ring. The dielectric layer is on the epitaxial layer in a termination area. The first metal layer is on the terminal trench structure and the dielectric layer. The passivation layer is on the first metal layer and the dielectric layer. The second metal layer is on the first metal layer and the passivation layer. Widths of the first, second and third ion implantation guard rings decrease in order, so that the voltage can be distributed step by step.

6 Claims, 4 Drawing Sheets

(56) References Cited

U.S. PATENT DOCUMENTS

| | | | | |
|---|---|---|---|---|
| 2010/0327288 | A1* | 12/2010 | Chao | H01L 29/407 |
| | | | | 257/64 |
| 2011/0084353 | A1* | 4/2011 | Chao | H01L 21/2256 |
| | | | | 257/484 |
| 2012/0205772 | A1* | 8/2012 | Chen | H01L 29/407 |
| | | | | 257/471 |
| 2012/0261751 | A1* | 10/2012 | Chao | H01L 29/407 |
| | | | | 257/336 |
| 2013/0140630 | A1* | 6/2013 | Chen | H01L 29/7827 |
| | | | | 257/330 |
| 2013/0168765 | A1* | 7/2013 | Lin | H01L 29/7397 |
| | | | | 257/334 |
| 2013/0228891 | A1* | 9/2013 | Kao | H01L 29/66621 |
| | | | | 257/494 |
| 2013/0313638 | A1* | 11/2013 | Yoshimochi | H01L 29/7813 |
| | | | | 257/334 |
| 2015/0123235 | A1* | 5/2015 | Lee | H01L 29/66143 |
| | | | | 257/471 |
| 2016/0071924 | A1* | 3/2016 | Masuda | H01L 21/049 |
| | | | | 257/77 |
| 2016/0099306 | A1* | 4/2016 | Cheng | H01L 29/402 |
| | | | | 257/476 |
| 2016/0163800 | A1* | 6/2016 | Sakai | H01L 29/66068 |
| | | | | 257/77 |
| 2016/0343881 | A1* | 11/2016 | Pang | H01L 29/0649 |
| 2017/0213908 | A1* | 7/2017 | Fursin | H01L 29/0615 |
| 2017/0323982 | A1* | 11/2017 | Scarpulla | H01L 21/0217 |

* cited by examiner

SCHOTTKY DIODE WITH MULTIPLE GUARD RING STRUCTURES

This application claims the benefit of Taiwan Patent Application Serial No. 109118410, filed Jun. 2, 2020, the subject matter of which is incorporated herein by reference.

BACKGROUND OF THE INVENTION

(1) Field of the Invention

The invention relates to a Schottky diode, and more particularly to a Schottky diode with multiple guard ring structures.

(2) Description of the Prior Art

Generally speaking, an ideal rectifier should be at least featured in a low forward voltage drop, a high reverse breakdown voltage and zero leakage current. For metal-semiconductor junctions are utilized as Schottky barriers to have characteristics in low forward voltage drop and high-speed switching, thus the Schottky diodes are widely applied to power rectifiers. However, since the Schottky diodes do have shortcomings in lower reverse bias and larger reverse leakage current, thus the applications of the Schottky diodes are substantially limited.

As described, the Schottky diodes are mainly classified into conventional planar Schottky diodes and trench Schottky diodes. A typical structure of the planar Schottky diodes is a stacking structure consisted of interchanging semiconductor layers and metal layers. As such, properties in the forward voltage drop and the leakage current shall be balanced. Namely, the topic in enhancing the breakdown voltage without increasing the leakage current is definitely welcome to the skilled in the art.

The trench Schottky diode is mainly formed by filling polysilicon into an etched trench of a silicon layer, such that the polysilicon in the trench can be used effectively to deplete drift electrons in a drift region, and thus the electric field distribution can be uniformed. In comparison to the conventional planar Schottky diode, the trench Schottky diode has much lower forward voltage drop (Low VF) and reverse leakage current (Low IR).

Referring to FIG. 1, a schematic cross-sectional view of a conventional trench Schottky diode is illustrated. As shown, the trench Schottky diode PA100 includes a semiconductor base layer PA1, a back metal layer PA2, an epitaxial layer PA3, a dielectric layer PA4, a first metal layer PA5, a passivation layer PA6 and a second metal layer PA7.

The back metal layer PA2 is formed on a back surface of the semiconductor base layer PA1, while the epitaxial layer PA3 is formed on a front surface of the semiconductor base layer PA1. The epitaxial layer is divided into a unit cell area PA3a and a termination area PA3b adjacent to each other. The epitaxial layer PA3 further includes a plurality of unit cell structures PA31 (two shown in the figure), a termination trench structure PA32 and a guard ring structure PA33. The plurality of unit cell structures PA31 are separately located in the unit cell area PA3a. The termination trench structure PA32 is located at a junction of the unit cell area PA3a and the termination area PA3b, and is separated from the neighboring unit cell structure PA31 in the termination area PA3b. The guard ring structure PA33 is adjacent to the termination trench structure PA32.

The dielectric layer PA4, disposed in the termination area PA3b, is stacked on the termination trench structure PA32 and the guard ring structure PA33. The first metal layer PA5 is stacked on the epitaxial layer PA3 in the unit cell area PA3a, and extended to stack the dielectric layer PA4 in the termination area PA3b. The passivation layer PA6 is stacked on the first metal layer PA5, and extended to the dielectric layer PA4 in the termination area PA3b from the unit cell area PA3a. The second metal layer PA7 is stacked on the first metal layer PA5 and the passivation layer PA6, and extended from the unit cell area PA3a to the termination area PA3b.

As described above, the conventional trench Schottky diode PA100 is mainly to extend the first metal layer PA5 and the second metal layer PA7 to the termination area PA3b so as increase the reverse bias, and to furnish the guard ring structure PA33 to the epitaxial layer PA3 so as to distribute the voltage level. However, since the guard ring structure PA33 can only provide limited ability to buffer the voltage level, thus electric charges of the trench Schottky diode PA100 would be clustered to the rim of the termination area PA3b, from which an early breakdown would be possible.

SUMMARY OF THE INVENTION

In order to increase the reverse bias of the conventional trench Schottky diode, the first metal layer and the second metal layer thereof are extended into the termination area, and thus surface charges would be easy to be accumulated on the epitaxial layer. Though the conventional trench Schottky diode is furnished with the guard ring structure to avoid severe variations in voltage levels, yet the corresponding improvement is still limited anyway. Accordingly, it is an object of the present invention to provide a Schottky diode that can reduce accumulation of surface charges through structural changes, such that an early breakdown can be avoided.

In the present invention, a Schottky diode with multiple guard ring structures includes a semiconductor base layer, a back metal layer, an epitaxial layer, a dielectric layer, a first metal layer, a passivation layer and a second metal layer.

The semiconductor base layer has a back surface and a front surface opposite to the back surface. The back metal layer is formed on the back surface of the semiconductor base layer. The epitaxial layer, formed on the front surface of the semiconductor base layer, has a unit cell area and a termination area. The epitaxial layer includes a termination trench structure, a first ion implantation guard ring, a second ion implantation guard ring and a third ion implantation guard ring.

The termination trench structure is disposed at a junction of the unit cell area and the termination area. The first ion implantation guard ring, disposed in the termination area by neighboring to the termination trench structure, has a first width. The second ion implantation guard ring, disposed in the termination area and separated from the first ion implantation guard ring, has a second width less than the first width. The third ion implantation guard ring, disposed in the termination area and separated from the second ion implantation guard ring, has a third width less than the second width.

The dielectric layer is stacked on the termination trench structure, the first ion implantation guard ring, the second ion implantation guard ring and the third ion implantation guard ring in the termination area.

The first metal layer includes a main body portion and a separation portion. The main body portion, stacked on the termination trench structure in the unit cell area, extends from the unit cell area to be stacked on the dielectric layer above the first ion implantation guard ring in the termination area. The separation portion, stacked on the dielectric layer in the termination area, extends toward the epitaxial layer to penetrate through the dielectric layer to electrically contact the third ion implantation guard ring. Further, a trench exposed out of the dielectric layer is formed between the separation portion and the main body portion.

The passivation layer, stacked on the main body portion in the unit cell area, extends to be stacked on the main body portion, the trench, the separation portion and the dielectric layer in the termination area. The second metal layer, stacked on the first metal layer and the passivation layer in the unit cell area, extends from the unit cell area to be stacked on the passivation layer above the first ion implantation guard ring in the termination area.

In one embodiment of the present invention, the second ion implantation guard ring is separated from the first ion implantation guard ring by a first spacing, the third ion implantation guard ring is separated from the second ion implantation guard ring by a second spacing, and the second spacing is larger than the first spacing. Preferably, a ratio of the first spacing and the second spacing is 1:1.2.

In one embodiment of the present invention, a ratio of the first width, the second width and the third width is 4:2:1.

In one embodiment of the present invention, the dielectric layer includes a TEOS film and a BPSG film, the TEOS film is stacked on the epitaxial layer in the termination area, and the BPSG film is stacked on the TEOS film in the termination area.

In one embodiment of the present invention, the epitaxial layer further includes a plurality of cell trench structures in the unit cell area.

As stated, the Schottky diode with multiple guard ring structures provided by the present invention divides the first metal layer into the main body portion and the separation portion to successfully avoid accumulation of surface charges by the separation portion. In addition, since the Schottky diode with multiple guard ring structures of the present invention is further furnished with the first ion implantation guard ring, the second ion implantation guard ring and the third ion implantation guard ring in the termination area, with individual widths to become smaller from the unit cell area toward the termination area. Thus, the voltage levels of the entire Schottky diode with multiple guard ring structures can present a stepwise variation, and thus possible early breakdown can be effectively avoided.

All these objects are achieved by the Schottky diode with multiple guard ring structures described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a Schottky diode with multiple guard ring structures. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 2:
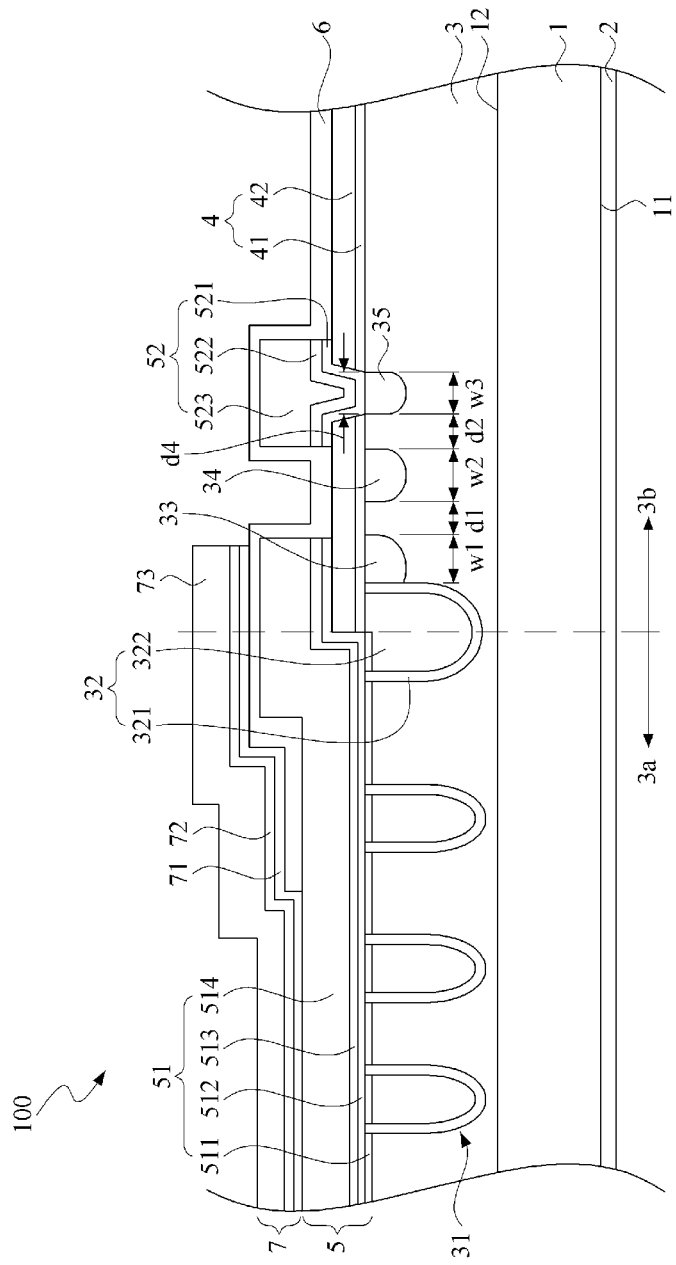
FIG. 2 is a schematic cross-sectional view of a preferred embodiment of the Schottky diode with multiple guard ring structures in accordance with the present invention.

Referring to FIG. 2, a schematic cross-sectional view of a preferred embodiment of the Schottky diode with multiple guard ring structures in accordance with the present invention is shown. As illustrated, the Schottky diode with multiple guard ring structures 100 includes a semiconductor base layer 1, a back metal layer 2, an epitaxial layer 3, a dielectric layer 4, a first metal layer 5, a passivation layer 6 and a second metal layer 7.

The semiconductor base layer 1, having a back surface 11 and a front surface 12 thereof opposite to each other, is an N-type heavily-doped silicon layer. The back metal layer 2, formed on the back surface 11 of the semiconductor base layer 1, can contain titanium, nickel, silver or any combination of the above elements. The epitaxial layer 3, formed on the front surface 12 of the semiconductor base layer 1, has a unit cell area 3a and a termination area 3b neighboring to the unit cell area 3a. In this embodiment, the epitaxial layer 3 is an N-type lightly-doped silicon layer, in which the light doping of the epitaxial layer 3 is compared to the heavy doping of the semiconductor base layer 1. In addition, the epitaxial layer 3 includes a plurality of cell trench structures 31 (one labeled in the figure), a termination trench structure 32, a first ion implantation guard ring 33, a second ion implantation guard ring 34 and a third ion implantation guard ring 35.

The plurality of cell trench structures 31 are disposed in the unit cell area 3a by being separated to each other. The termination trench structure 32 is disposed at the junction of the unit cell area 3a and the termination area 3b. In other words, the termination trench structure 32 is across the unit cell area 3a and termination area 3b. In this embodiment, the termination trench structure 32 further includes a gate oxide layer 321 and a polysilicon layer 322, in which the gate oxide layer 321 and the polysilicon layer 322 are formed by forming a groove on the epitaxial layer 3, then oxidizing an inner wall of the groove so as to form the gate oxide layer 321, and finally the polysilicon is fed into the groove so as to form the polysilicon layer 322. In addition, the cell trench structure 31 is structurally resembled to the termination trench structure 32. Thus, the cell trench structure 31 includes also a gate oxide layer (not labeled in the figure) and a polysilicon layer (not labeled in the figure).

The first ion implantation guard ring 33, disposed in the termination area 3b by neighboring to the gate oxide layer 321 of the termination trench structure 32, has a first width w1. The second ion implantation guard ring 34, disposed in the termination area 3b and separated from the first ion implantation guard ring 33 by a first spacing d1, has a second width w2 less than the first width w1. The third ion implantation guard ring 35, disposed in the termination area 3b and separated from the 內 second ion implantation guard ring 34 by a second spacing d2 larger than the first spacing d1, has a third width w3 less than the second width w2. In this embodiment, a ratio of the first width w1, the second width w2 and the third width w3 is 4:2:1, and another ratio of the first spacing d1 and the second spacing d2 is 1:1.2. In particular, the first width w1 is 8 μm, the second width w2 is 4 μm, the third width w3 is 2 μm, the first spacing d1 is 10 μm, and the second spacing d2 is 12 μm.

In addition, in practical applications, each of the first ion implantation guard ring 33, the second ion implantation guard ring 34 and the third ion implantation guard ring 35 is formed by implanting boron ions onto the epitaxial layer 3 in the termination area 3b. In this embodiment, each of the first width w1, the second width w2 and the third width w3 is the instant width while in implanting the boron ions. Practically, the width after the implanting would be larger due to a diffusion effect.

The dielectric layer 4 includes a tetraethyl orthosilicate (TEOS) film 41 and a borophosphosilicate glass (BPSG) film 42. The TEOS film 41 is stacked on the termination trench structure 32, the first ion implantation guard ring 33, the second ion implantation guard ring 34 and the third ion implantation guard ring 35 of the epitaxial layer 3 in the termination area 3b, while the BPSG film 42 is stacked on the TEOS film 41 in the termination area 3b.

The first metal layer 5, includes a main body portion 51 and a separation portion 52. The main body portion 51 is stacked on the termination trench structure 32 in the unit cell area 3a, and extended from the unit cell area 3a to the termination area 3b by stacking on the dielectric layer 4 above the first ion implantation guard ring 33. As shown, in the unit cell area 3a, the main body portion 51 includes a nickel-platinum alloy layer 511, a titanium layer 512, a titanium-tungsten alloy layer 513 and an aluminum layer 514. The nickel-platinum alloy layer 511 is stacked on the epitaxial layer 3 and contacting the polysilicon layer (not labeled in the figure) of the cell trench structure 31. The titanium layer 512 is stacked on the nickel-platinum alloy layer 511 in the unit cell area 3a, and extended from the unit cell area 3a to the termination area 3b for stacking onto the dielectric layer 4 above the first ion implantation guard ring 33. The titanium-tungsten alloy layer 513 is stacked on the titanium layer 512 in the unit cell area 3a, and extended from the unit cell area 3a to the termination area 3b for stacking on the titanium layer 512. The aluminum layer 514 is stacked on the titanium-tungsten alloy layer 513 in the unit cell area 3a, and extended from the unit cell area 3a to the termination area 3b for stacking on the titanium-tungsten alloy layer 513.

The separation portion 52 is stacked on the dielectric layer 4 in the termination area 3b, and extended toward the epitaxial layer 3 by penetrating the dielectric layer 4 to electrically contact the third ion implantation guard ring 35. Between the separation portion 52 and the main body portion 51, a trench (not labeled in the figure) exposed out of the dielectric layer 4 is formed. The separation portion 52 further includes a titanium layer 521, a titanium-tungsten alloy layer 522 and a aluminum layer 523. The titanium layer 521 is the BPSG film 42 stacked on the dielectric layer 4. The titanium-tungsten alloy layer 522 is stacked on the titanium layer 521. The aluminum layer 523, stacked on the titanium-tungsten alloy layer 522, further extends toward the epitaxial layer 3 to penetrate through the titanium layer 521, the titanium-tungsten alloy layer 522 and both the BPSG film 42 and the TEOS film 41 of the dielectric layer 4 so as to electrically contact the third ion implantation guard ring 35. Practically, the third spacing d4 of the TEOS film 41 can be 2 μm.

In a manufacturing process, the titanium layer 512 and the titanium layer 521 are formed by the same sputtering process, the titanium-tungsten alloy layer 513 and the titanium-tungsten alloy layer 522 are formed by the same sputtering process, and also the aluminum layer 514 and the aluminum layer 523 are formed by the same sputtering process. In addition, the aluminum layer 523, the titanium-tungsten alloy layer 522 and the titanium layer 521 are introduced to penetrate through the dielectric layer 4 so as to have the titanium layer 521 further to electrically contact the third ion implantation guard ring 35. Thereby, the aluminum layer 523 can be electrically connected to the third ion implantation guard ring 35 via the titanium-tungsten alloy layer 522 and the titanium layer 521. Before the titanium layer 521, the titanium-tungsten alloy layer 522 and the aluminum layer 523 are formed, the dielectric layer 4 above the third ion implantation guard ring 35 is grooved by etching or a laser means, such that the titanium layer 521, the titanium-tungsten alloy layer 522 and the aluminum layer 523 can penetrate through the dielectric layer 4 to electrically contact the third ion implantation guard ring 35.

In addition, after the titanium layers 512, 521, the titanium-tungsten alloy layers 513, 522 and the aluminum layers 514, 523 are formed, another etching process is applied to form grooves for separating the main body portion 51 and the separation portion 52.

The passivation layer 6 is stacked on the main body portion 51 in the unit cell area 3a, and extended to be stacked on the main body portion 51, a trench between the separation portion 52 and main body portion 51, the separation portion 52 and the dielectric layer 4 in the termination area 3b. In this embodiment, the passivation layer 6 is a silicon nitride layer.

The second metal layer 7 is stacked on the first metal layer 5 and the passivation layer 6 in the unit cell area 3a, and extended from the unit cell area 3a to be stacked on the passivation layer 6 above the first ion implantation guard ring 33 in the termination area 3b. The second metal layer 7 includes a titanium layer 71, a nickel layer 72 and a silver layer 73. The titanium layer 71 is stacked on the aluminum layer 514 of the first metal layer 5 and the passivation layer 6. The nickel layer 72 is stacked on the titanium layer 71. The silver layer 73 is stacked on the nickel layer 72.

Figure 3:
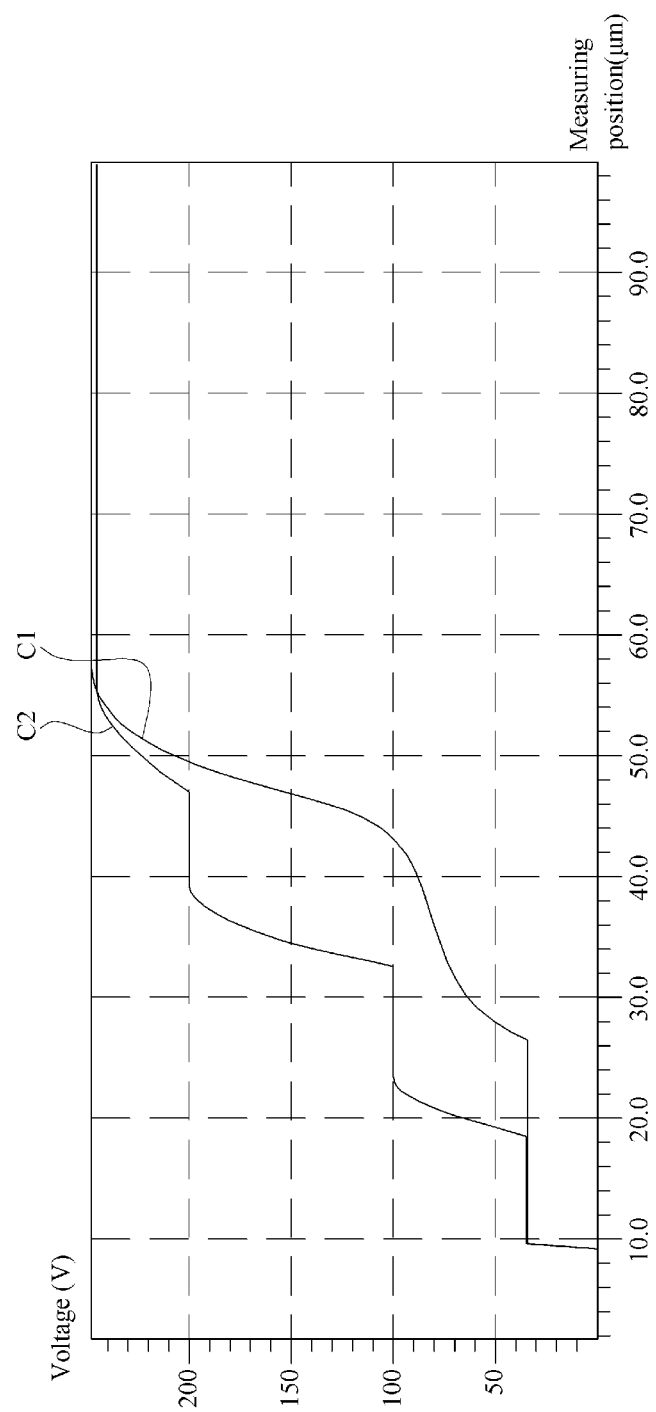
FIG. 3 demonstrates schematically voltage distribution curves of the Schottky diode with multiple guard ring structures of FIG. 2.
Figure 4:
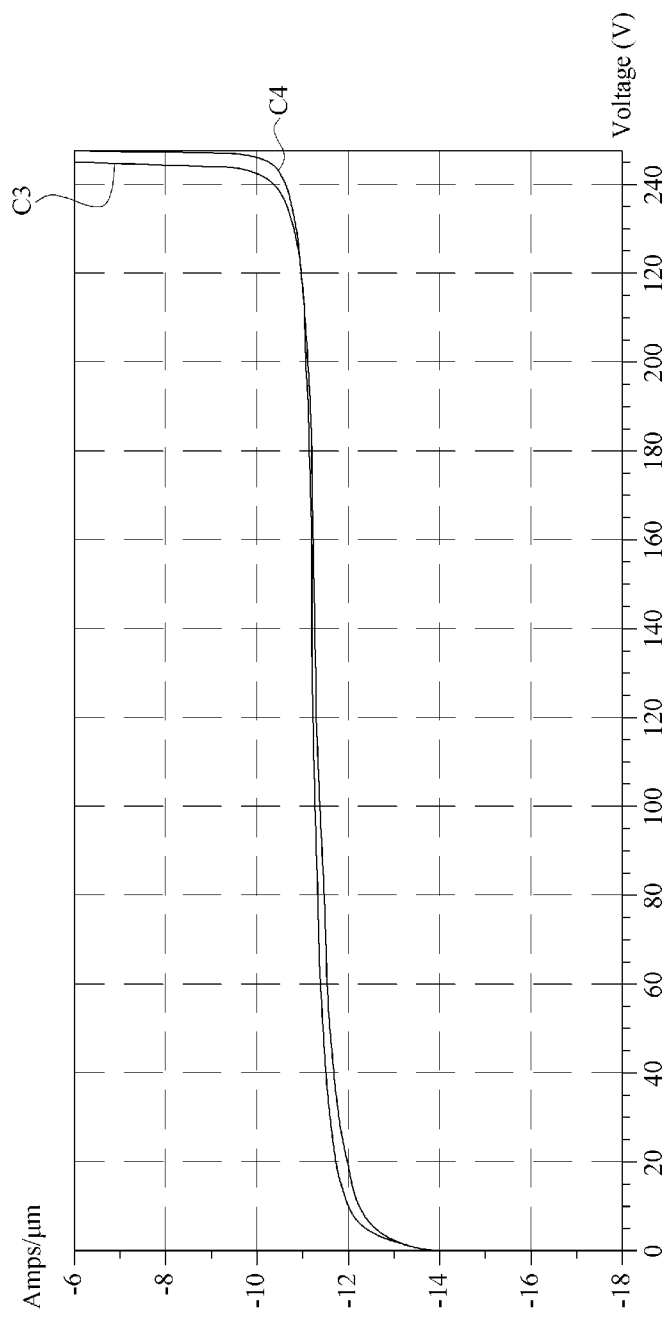
FIG. 4 demonstrates schematically reverse bias curves of the Schottky diode with multiple guard ring structures of FIG. 2.

Refer to FIG. 3 and FIG. 4; where FIG. 3 demonstrates schematically voltage distribution curves of the Schottky diode with multiple guard ring structures of FIG. 2, and FIG. 4 demonstrates schematically reverse bias curves of the Schottky diode with multiple guard ring structures of FIG. 2.

Figure 1:
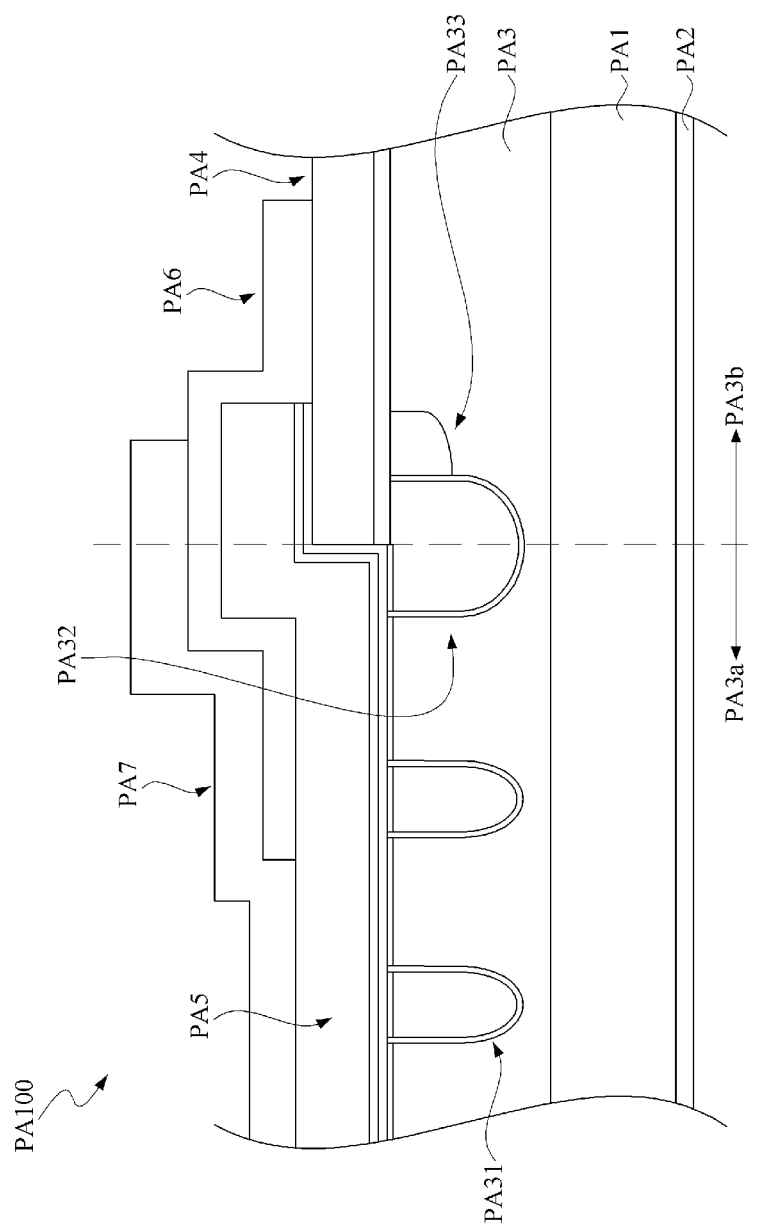
FIG. 1 is a schematic cross-sectional view of a conventional trench Schottky diode.

As shown in FIG. 1 through FIG. 3, Curve C1 of FIG. 3 is accounted for the conventional trench Schottky diode PA100 of FIG. 1, while Curve C2 thereof is accounted for the Schottky diode with multiple guard ring structures 100 provided by the present invention as shown in FIG. 2. The conventional trench Schottky diode PA100 applies the guard ring structure PA33 to maintain the voltage level of Curve C1 at around 35V. However, after passing the guard ring structure PA33, the voltage level would quickly rise to 250V. On the other hand, in the Schottky diode with multiple guard ring structures 100 of the present invention, the first ion implantation guard ring 33 is applied to firstly maintain the voltage level at around 35V, then the second ion implantation guard ring 34 is applied to maintain the voltage level at around 100V, and finally the third ion implantation guard ring 35 is applied to maintain the voltage level at around 200V. Thus, with the Schottky diode with multiple guard ring structures 100 of the present invention to apply the first ion implantation guard ring 33, the second ion implantation guard ring 34 and the third ion implantation guard ring 35, the corresponding voltage levels can present a stepwise variation, and so the voltage levels can be more effectively distributed, such that possible early breakdown can be avoided.

In addition, since the Schottky diode with multiple guard ring structures 100 of the present invention is further furnished with the separation portion 52 to top and thus electrically contact the third ion implantation guard ring 35, thus the accumulation of surface charges can be effectively avoided.

On the other hand, as shown in FIG. 4, Curve C3 of FIG. 4 is accounted for variation in reverse voltages of the conventional trench Schottky diode PA100 of FIG. 1, while Curve C4 thereof is accounted for another variation in reverse voltages of the Schottky diode with multiple guard ring structures 100 provided by the present invention as shown in FIG. 2. It is obvious that the Schottky diode with multiple guard ring structures 100 of the present invention can maintain almost the same response in reverse bias, with respect to the conventional trench Schottky diode PA100.

In summary, in comparison with the conventional trench Schottky diode who extends both the first metal layer and the second metal layer into the termination area so as to increase the reverse bias but inevitably lead to accumulate excessive surface charges on the epitaxial layer, the Schottky diode with multiple guard ring structures provided by the present invention divides the first metal layer into the main body portion and the separation portion to successfully avoid accumulation of surface charges by the separation portion. In addition, since the Schottky diode with multiple guard ring structures of the present invention is further furnished with the first ion implantation guard ring, the second ion implantation guard ring and the third ion implantation guard ring in the termination area, with individual widths to become smaller from the unit cell area toward the termination area. Thus, the voltage levels of the entire Schottky diode with multiple guard ring structures can present a stepwise variation, and thus possible early breakdown can be effectively avoided.

While the present invention has been particularly shown and described with reference to a preferred embodiment, it will be understood by those skilled in the art that various changes in form and detail may be without departing from the spirit and scope of the present invention.

What is claimed is:

1. A Schottky diode with multiple guard ring structures, comprising:
    a semiconductor base layer, having a back surface and a front surface opposite to the back surface;
    a back metal layer, formed on the back surface of the semiconductor base layer;
    an epitaxial layer, formed on the front surface of the semiconductor base layer, having a unit cell area and a termination area, including:
        a termination trench structure, disposed at a junction of the unit cell area and the termination area;
        a first ion implantation guard ring, disposed in the termination area by neighboring to the termination trench structure, having a first width;
        a second ion implantation guard ring, disposed in the termination area, separated from the first ion implantation guard ring, having a second width less than the first width; and
        a third ion implantation guard ring, disposed in the termination area, separated from the second ion implantation guard ring, having a third width less than the second width;
    a dielectric layer, stacked on the termination trench structure, the first ion implantation guard ring, the second ion implantation guard ring and the third ion implantation guard ring in the termination area;
    a first metal layer, including:
        a main body portion, stacked on the termination trench structure in the unit cell area, extending from the unit cell area to be stacked on the dielectric layer above the first ion implantation guard ring in the termination area; and
        a separation portion, stacked on the dielectric layer in the termination area, extending toward the epitaxial layer to penetrate through the dielectric layer to electrically contact the third ion implantation guard ring, wherein a trench exposed out of the dielectric layer is formed between the separation portion and the main body portion;
    a passivation layer, stacked on the main body portion in the unit cell area, extending to be stacked on the main body portion, the trench, the separation portion and the dielectric layer in the termination area; and
    a second metal layer, stacked on the first metal layer and the passivation layer in the unit cell area, extending from the unit cell area to be stacked on the passivation layer above the first ion implantation guard ring in the termination area.

2. The Schottky diode with multiple guard ring structures of claim 1, wherein the second ion implantation guard ring is separated from the first ion implantation guard ring by a first spacing, the third ion implantation guard ring is separated from the second ion implantation guard ring by a second spacing, and the second spacing is larger than the first spacing.

3. The Schottky diode with multiple guard ring structures of claim 2, wherein a ratio of the first spacing and the second spacing is 1:1.2.

4. The Schottky diode with multiple guard ring structures of claim 1, wherein a ratio of the first width, the second width and the third width is 4:2:1.

5. The Schottky diode with multiple guard ring structures of claim 1, wherein the dielectric layer includes a TEOS film and a BPSG film, the TEOS film is stacked on the epitaxial layer in the termination area, and the BPSG film is stacked on the TEOS film in the termination area.

6. The Schottky diode with multiple guard ring structures of claim 1, wherein the epitaxial layer further includes a plurality of cell trench structures in the unit cell area.

\* \* \* \* \*